(12) United States Patent
Cho et al.

(10) Patent No.: US 8,313,847 B2
(45) Date of Patent: Nov. 20, 2012

(54) INFORMATION STORAGE DEVICES USING MAGNETIC DOMAIN WALL MOVEMENT

(75) Inventors: Young-jin Cho, Suwon-si (KR);
Ji-young Bae, Busan (KR); Sung-chul Lee, Osan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 722 days.

(21) Appl. No.: 12/155,980

(22) Filed: Jun. 12, 2008

(65) Prior Publication Data
US 2009/0185312 A1    Jul. 23, 2009

(30) Foreign Application Priority Data
Jan. 21, 2008  (KR) .................. 10-2008-0006234

(51) Int. Cl.
*G11B 5/66* (2006.01)
(52) U.S. Cl. .............. 428/827; 365/81; 365/85; 365/87; 365/171; 365/173
(58) Field of Classification Search .............. 365/81, 365/87, 158, 171; 369/126; 428/3; 360/131
See application file for complete search history.

(56) References Cited

U.S. PATENT DOCUMENTS

| | | | |
|---|---|---|---|
| 6,781,871 B2 | 8/2004 | Park et al. | |
| 6,834,005 B1 | 12/2004 | Parkin | |
| 2005/0078509 A1* | 4/2005 | Parkin | 365/158 |
| 2005/0104101 A1 | 5/2005 | Sun et al. | |

FOREIGN PATENT DOCUMENTS

| | | |
|---|---|---|
| EP | 0632437 | 1/1995 |
| JP | 1994-325419 | 11/1994 |

OTHER PUBLICATIONS

S. Mangin et al., "Current-induced magnetization reversal in nanopillars with perpendicular anisotropy" Nature Materials. vol. 5, Mar. 2006. pp. 210-215.*
S. Mangin et al., "Current-induced magnetization reversal in nanopillars with perpendicular anisotropy" nature materials, vol. 5, Mar. 2006, pp. 210-215.

* cited by examiner

*Primary Examiner* — Holly Rickman
*Assistant Examiner* — Lisa Chau
(74) *Attorney, Agent, or Firm* — Harness, Dickey & Pierce, P.L.C.

(57) ABSTRACT

Information storage devices are provided. An information storage device includes a track including at least one Co alloy layer and a soft magnetic layer. The track further includes a plurality of magnetic domains. A current applying element is connected to the track. The track includes a plurality of layers stacked alternately.

23 Claims, 9 Drawing Sheets

INFORMATION STORAGE DEVICES USING MAGNETIC DOMAIN WALL MOVEMENT

PRIORITY STATEMENT

This application claims priority under 35 U.S.C. §119 to Korean Patent Application No. 10-2008-0006234, filed on Jan. 21, 2008, in the Korean Intellectual Property Office, the disclosure of which is incorporated herein in its entirety by reference.

BACKGROUND

Description of the Related Art

Conventional nonvolatile information storage devices retain recorded information even when power is turned off. Examples of conventional nonvolatile information storage devices include hard disc drives (HDDs) and nonvolatile random access memories (RAMs).

A conventional HDD stores recorded information using a rotating part. The rotating part may wear down over time, and thus, may have a relatively high possibility of operational failure. This may reduce reliability.

An example conventional nonvolatile RAM is a flash memory. Unlike conventional HDDS, conventional flash memories do not utilize a rotating part. But, conventional flash memories have relatively slow reading and writing speeds, relatively short life spans, relatively small storage capacities, and relatively high manufacturing costs when compared to conventional HDDs.

Another example nonvolatile information storage device uses principles of magnetic domain wall movement of a magnetic material. In these magnetic domain information storage devices, a magnetic region that constitutes a magnetic body is referred to as a magnetic domain. A boundary portion between magnetic domains is referred to as a magnetic domain wall. The magnetic domain walls have different magnetization directions relative to the magnetic domains. The magnetic domain walls have given volumes, and may be moved in the magnetic body by applying a current to the magnetic body. For example, the magnetic domain wall may be moved by applying a torque to the magnetic domain wall using electrons having a particular spin direction by applying a current to the magnetic body having the magnetic domain wall. This conventional technique is referred to as magnetic domain wall movement by spin transfer torque.

But, if electrons having a particular spin direction are not properly transmitted to the magnetic domain wall in the magnetic body, the magnetic domain wall may not be readily moved. Conventional magnetic domain information storage devices have relatively low recording densities and relatively rough magnetic domain wall movement characteristics, which results in relatively low performance and relatively low integration density.

For example, a conventional storage track having a CoFe layer (or a Co layer) and a Pt layer (or a Pd layer) stacked alternately may have perpendicular magnetic anisotropy, but the movement of the magnetic domain wall may be interrupted due to Pt (or Pd) because the Pt (or Pd) is a nonmagnetic material. In this example, the flow of electrons for moving a magnetic domain wall may not be sufficiently smooth due to a relatively high ratio of the nonmagnetic material.

SUMMARY

Example embodiments relate to information storage devices, for example, information storage devices using magnetic domain wall movement.

At least one example embodiment provides an information storage device using magnetic domain wall movement. The information storage device may include a track having a plurality of magnetic domains and a current applying element or unit connected to the track. The track may include a first Co alloy layer and a soft magnetic layer.

According to at least some example embodiments, the track may have a [Co alloy layer/soft magnetic layer]$_n$ structure in which the first Co alloy layer and the soft magnetic layer are alternately stacked n times. In another example, the track may have a [Co alloy layer/soft magnetic layer/Co alloy layer]$_n$ structure in which the first Co alloy layer, the soft magnetic layer, and a second Co alloy layer are alternately stacked n times. Alternatively, the track may have a [Co alloy layer/soft magnetic layer/crystal orientation layer]$_n$ structure in which the first Co alloy layer, the soft magnetic layer, and a crystal orientation layer are alternately stacked n times. In yet another example embodiment, the track may have a [Co alloy layer/soft magnetic layer/Co alloy layer/crystal orientation layer]$_n$ structure in which the first Co alloy layer, the soft magnetic layer, the second Co alloy layer, and the crystal orientation layer are alternately stacked n times.

According to at least some example embodiments, n may be an integer satisfying $1 \leq n \leq 5$. The first and second Co alloy layers may be a $Co_{(1-x)}Fe_x$ layer, where $0 \leq x \leq 0.4$. The soft magnetic layer may include at least one selected from Co, Fe, Ni, an alloy thereof or the like. The soft magnetic layer may be a Ni or similar layer. The first Co alloy layer and the second Co alloy layer may have a thickness of between about 0.1 nm to about 1 nm, inclusive. The soft magnetic layer may have a thickness of between about 0.1 nm to about 2 nm, inclusive. The crystal orientation layer may include at least one material selected from the group consisting of or including Pt, Ru, Ir, Cu, Pd, Au, an alloy thereof, or the like. The crystal orientation layer may have a thickness of between about 0.1 nm to about 2 nm, inclusive.

According to at least some example embodiments, the track may have a perpendicular magnetic anisotropy. The information storage device may further include a crystal orientation layer on a lower surface of the track. The information storage device may further include an oxidation suppression layer on an upper surface of the track. The crystal orientation layer may include at least one material selected from the group consisting of or including Pt, Ru, Ir, Cu, Pd, Au, an alloy thereof, or the like.

According to at least some example embodiments, the oxidation suppression layer may include at least one material selected from the group consisting of or including, Pt, Ru, Ir, Cu, Pd, Au, an alloy or combination thereof or the like.

According to at least some example embodiments, the information storage device may include a plurality of tracks identical or substantially identical to the track. The tracks may be arranged in directions parallel and/or perpendicular to a substrate.

According to at least one other example embodiment, an information storage device may include a plurality of tracks. At least one of the plurality of tracks may include a plurality of magnetic domains and a current applying element or unit connected to the track. The at least one track may include a first Co alloy layer and a soft magnetic layer. The plurality of tracks may be arranged in directions parallel and/or perpendicular to a substrate.

BRIEF DESCRIPTION OF THE DRAWINGS

Example embodiments will become more apparent by describing in detail the attached drawings in which.

DETAILED DESCRIPTION OF EXAMPLE EMBODIMENTS

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 1:
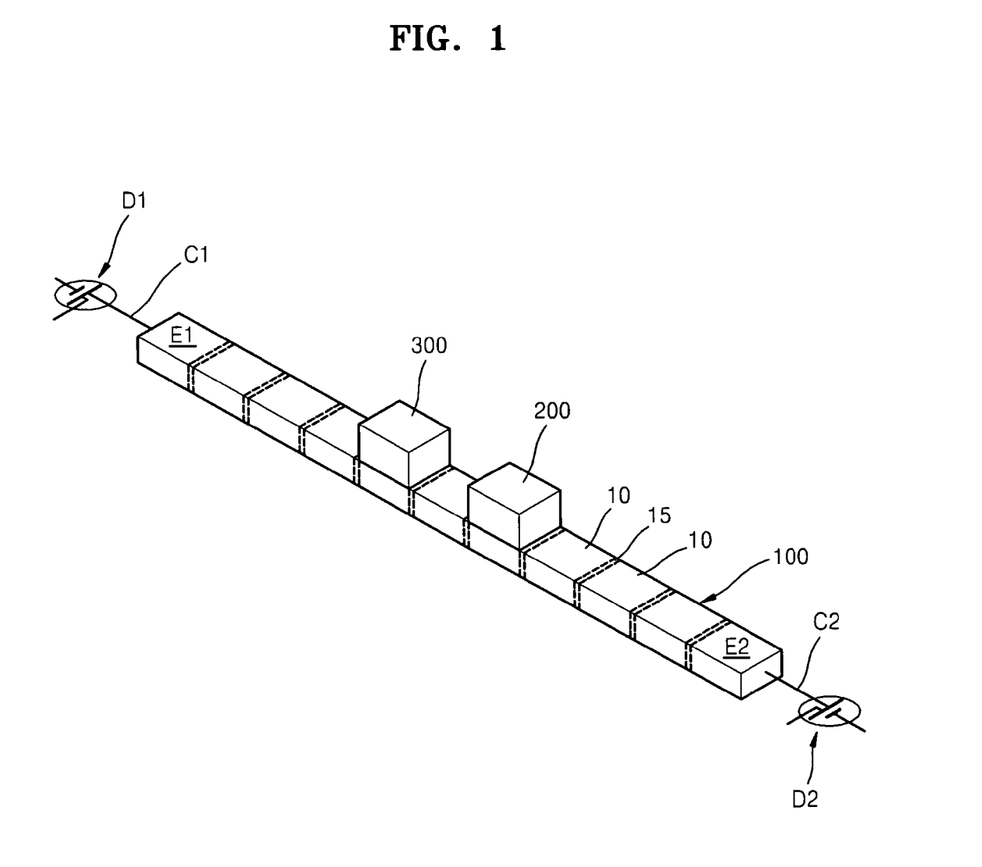
FIG. 1 is a perspective view of an information storage device according to an example embodiment.

FIG. 1 is a perspective view of an information storage device according to an example embodiment.

Referring to FIG. 1, an information storage device may include a storage track 100 for storing information, such as multi-bit data. The storage track 100 may include a plurality of magnetic domain regions 10. A magnetic domain wall region 15 may be arranged between each magnetic domain region 10. Each of the magnetic domain regions 10 may be a unit region in which data may be stored. Notches (not shown) for pinning of magnetic domain walls may be formed on side surfaces of the storage track 100 corresponding to the magnetic domain wall regions 15.

The storage track 100 may have a stack structure including at least one Co or Co alloy layer and at least one soft magnetic layer. Example embodiments of this stack structure will be described in more detail below. The Co or Co alloy layer may be, for example, $Co_{(1-x)}Fe_x$, where $0 \leq x \leq 0.4$. The soft magnetic layer may be a layer including at least one of Co, Ni, Fe, an alloy thereof, or the like. For example, the soft magnetic layer may be one selected from a Ni layer, a Co layer, a Fe layer, a CoFe layer, a NiFe layer, a CoFeNi layer, a CoZrNb layer, a CoTaZr layer, or the like. Such soft magnetic layers have a relatively small magnetic moment per unit volume, and may facilitate the storage track 100 having perpendicular magnetic anisotropy together with the Co alloy layer. The Co alloy layer may have a thickness of between about 0.1 nm to about 1 nm, inclusive. The soft magnetic layer may have a thickness of between about 0.1 nm to about 2 nm, inclusive. The storage track 100 having the above-discussed structure may have perpendicular magnetic anisotropy and the magnetic domain wall in the storage track 100 may be moved more easily.

As discussed above, a conventional storage track having a CoFe layer (or a Co layer) and a Pt layer (or a Pd layer) stacked alternately may have perpendicular magnetic anisotropy, but the movement of the magnetic domain wall may be interrupted due to Pt (or Pd) because the Pt (or Pd) is a non-magnetic material. However, because storage track 100 according to example embodiments does not include a non-magnetic material or includes a smaller amount than the conventional storage track, the magnetic domain wall in the storage track 100 may be moved more easily. Thus, according to at least some example embodiments, the magnetic domain wall may be moved with a smaller current as compared to the conventional art, and an information storage device having reduced power consumption may be realized.

Still referring to FIG. 1, a first conductive wire C1 may be connected to a first end E1 of the storage track 100, and a second conductive wire C2 may be connected to a second end E2 of the storage track 100. The first conductive wire C1 may also be connected to a first driving device D1. The second conductive wire C2 may also be connected to a second driving device D2. The first and second driving devices D1 and D2 may be transistors or other devices such as diodes. The first and second driving devices D1 and D2 and the first and second conduction wires C1 and C2 may constitute a current applying element or unit for applying a current to the storage track 100 to move the magnetic domain wall. The current applying element according to an example embodiment is not limited to the current applying element of FIG. 1 and may be modified in various ways. For example, instead of connecting the first and second conductive wires C1 and C2 to the first and second driving devices D1 and D2, respectively, one of the first and second conductive wires C1 and C2 may be connected to at least one driving device.

In the structure of FIG. 1, a current for moving the magnetic domain wall may be applied to the storage track 100 by the first and/or the second driving devices D1 and/or D2. The movement direction of the magnetic domain wall may be determined according to the direction of the current. The magnetic domain wall moves in the direction of the electrons which is opposite to the direction of the current direction.

A reading unit 200 configured to reproduce data and a writing unit 300 configured to write data may be formed on given or desired regions of the storage track 100. Each of the reading unit 200 and the writing unit 300 may be arranged on a region of the storage track 100 corresponding to one of the magnetic domain regions 10. The reading unit 200 and the writing unit 300 may use a tunnel magneto resistance (TMR) effect or a giant magneto resistance (GMR) effect. Devices that use the TMR effect or the GMR effect are well known in the art, and thus, a detailed description will be omitted. The principles and structures of the reading unit 200 and the writing unit 300 are not limited to the above descriptions, and thus, may be modified in various ways. For example, alternatively, the writing unit 300 may be a device that records data using an external magnetic field. In this example, the storage track 100 and the writing unit 300 may be spaced a given or desired distance apart from each other. Also, instead of including the reading unit 200 and the writing unit 300, a one-unit type reading/writing unit that performs both writing and reading may be included.

While moving the magnetic domain wall in a bit unit by applying a given or desired pulse current to the storage track 100 using the first and/or second driving devices D1 and/or D2, data recorded in the storage track 100 may be reproduced by applying a reading current to the reading unit 200 and data may be recorded onto the storage track 100 by applying a write current to the writing unit 300.

Although not shown in FIG. 1, the storage track 100 may be formed on a crystal orientation layer. In the storage track 100, the crystal orientation layer may improve the crystal orientation of the Co alloy layer. The improved crystal orientation may facilitate a more perpendicular magnetic anisotropy of the storage track 100. The crystal orientation layer may be formed on an adhesion layer. Also, an oxidation suppression layer may be formed on the storage track 100. The oxidation suppression layer may be configured to suppress and/or prevent oxidation of the storage track 100. The oxidation suppression layer may not be formed on portions of the storage track 100 where the reading unit 200 and the writing unit 300 are formed. A capping layer covering the reading unit 200 and the writing unit 300 may be formed on the oxidation suppression layer.

FIGS. 2A through 2D are cross-sectional views illustrating various structures of the storage track 100 of FIG. 1 and detailed lower and upper structures of the storage track 100 according to example embodiments. Any of the first through fourth storage tracks 100a through 100d may serve as the storage track 100 of FIG. 1. The structures of the first through fourth storage tracks 100a through 100d of FIGS. 2A through 2D may be included in first through fourth stack patterns 130a through 130d, respectively.

Figure 2A:
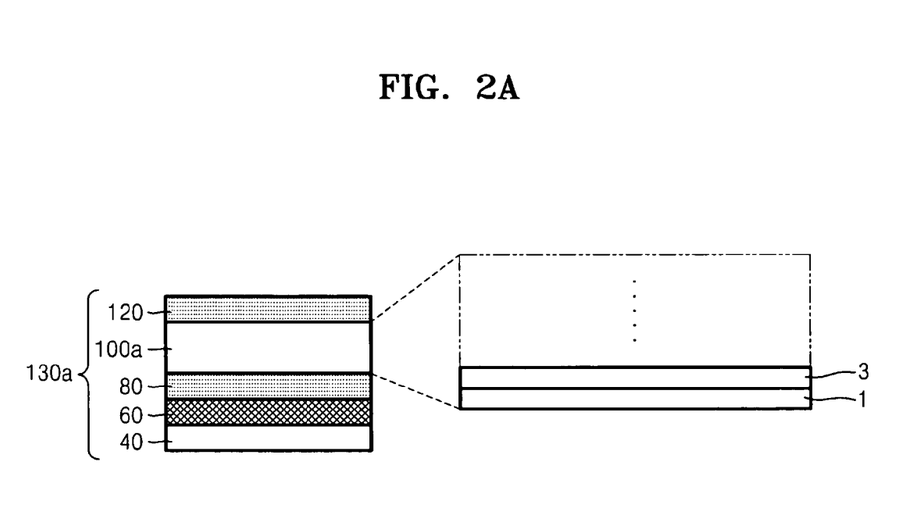
FIGS. 2A through 2D are cross-sectional views of stack patterns according to an example embodiment.

Referring to FIG. 2A, a first stack pattern 130a may include an insulating layer 40, an adhesion layer 60, a crystal orientation layer 80, the first storage track 100a, and an oxidation suppression layer 120 stacked sequentially. The adhesion layer 60 may be formed to increase adhesion force between upper and lower layers. The adhesion layer 60 may be, for example, a Ta layer, a TaN layer, a Ti layer, a TiN layer, a combination thereof or the like. The crystal orientation layer 80 may increase crystal orientation of the first storage track 100a (e.g., a CO alloy layer) formed thereon. The crystal orientation layer 80 may include at least one selected from Pt, Ru, Ir, Cu, Pd, Au, an alloy thereof, or the like. In one example, the crystal orientation layer 80 may be a Pt layer. The crystal orientation layer 80 may have an orientation plane of (111) plane or (0001) plane, which is equivalent to the (111) plane. The orientation plane may be parallel or substantially parallel to a substrate. The oxidation suppression layer 120 may include at least one selected from Pt, Ru, Ir, Cu, Pd, Au, an alloy thereof, or the like. The insulating layer 40 may be replaced by a semiconductor layer or a conductive layer. A given or desired substrate (not shown) may be provided under the insulating layer 40. In some cases, at least one of the insulating layer 40, the adhesion layer 60, the crystal orientation layer 80, and the oxidation suppression layer 120 may be omitted.

Figure 2B:
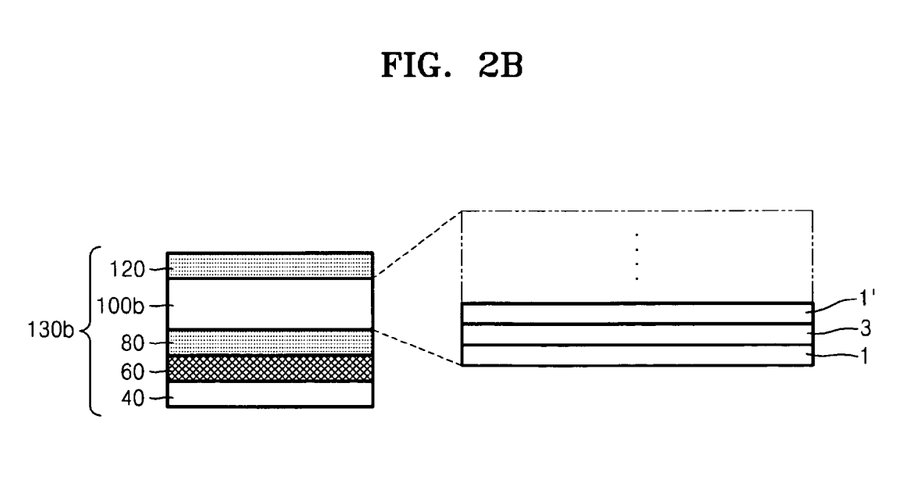
Figure 2C:
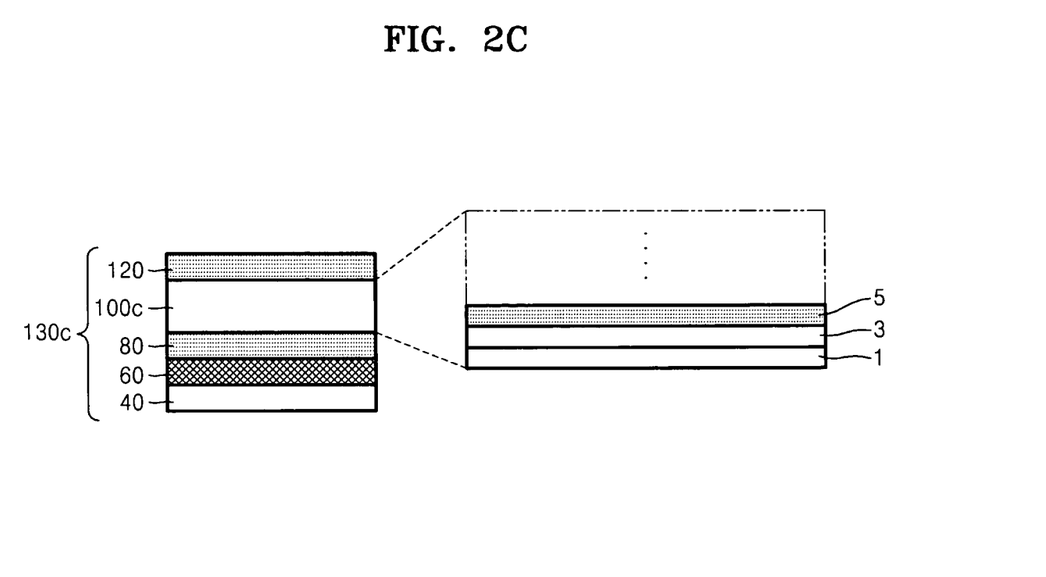
Figure 2D:
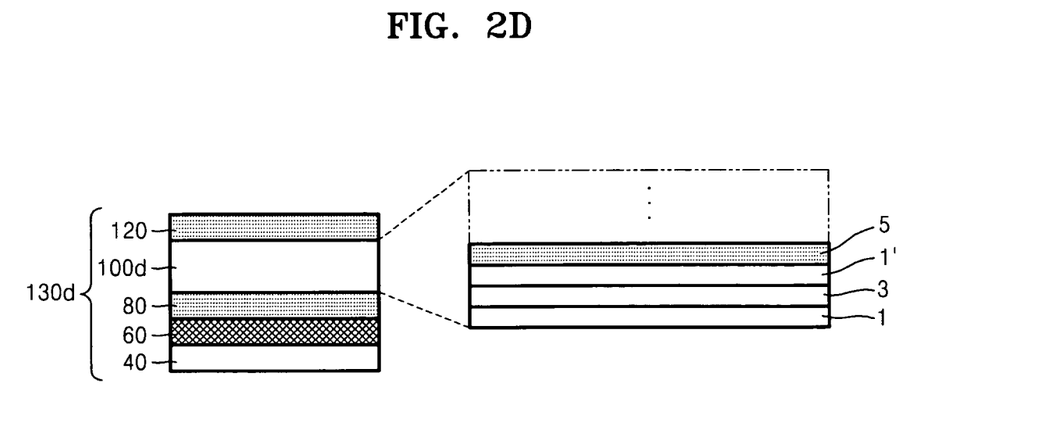

The structures of FIGS. 2B through 2D may be formed by replacing the first storage track 100a of FIG. 2A with the plurality of (e.g., second through fourth) storage tracks 100b through 100d. Thus, the insulating layer 40, the adhesion layer 60, the crystal orientation layer 80, and the oxidation suppression layer 120 of FIGS. 2B through 2D may be the same or substantially the same as those of FIG. 2A. Accordingly, a detailed discussion of these layers will be omitted from the discussion of FIGS. 2B-2D.

The first through fourth storage tracks 100a through 100d will now be described in detail with reference to enlarged portions of FIGS. 2A through 2D.

Referring to the enlarged portion of FIG. 2A, the first storage track 100a may have a [Co alloy layer/soft magnetic layer]$_n$ structure in which a first Co alloy layer 1 and a soft magnetic layer 3 may be alternately stacked n times, where n is an integer.

Referring to the enlarged portion of FIG. 2B, the second storage track 100b may have a [Co alloy layer/soft magnetic layer/Co alloy layer]$_n$ structure in which the first Co alloy layer 1, the soft magnetic layer 3, and a second Co alloy layer 1' may be alternately stacked n times. The first Co alloy layer 1 and the second Co alloy layer 1' may be similar or substantially similar layers, but may differ from each other in composition and/or thickness. The first Co layer 1 and the second Co layer 1' in FIG. 2D—described in more detail below—may differ in the same manner.

Referring to the enlarged portion of FIG. 2C, the third storage stack 100c may have a [Co alloy layer/soft magnetic layer/crystal orientation layer]$_n$ structure in which the first Co alloy layer 1, the soft magnetic layer 3, and another crystal orientation layer are alternately stacked n times.

Referring to the enlarged portion of FIG. 2D, the fourth storage stack 100d may have a [Co alloy layer/soft magnetic layer/Co alloy layer/crystal orientation layer]$_n$ structure in which the first Co alloy layer 1, the soft magnetic layer 3, the second Co alloy layer 1', and another crystal orientation layer 5 may be alternately stacked n times.

In FIGS. 2A through 2D, both the first Co alloy layer 1 and the second Co alloy layer 1' may be a $Co_{(1-x)}Fe_x$ layer, where $0 \leq x \leq 0.4$. The soft magnetic layer 3 may include at least one selected from Co, Ni, and Fe, an alloy thereof or the like. For example, the soft magnetic layer 3 may be a Ni layer, a Co layer, a Fe layer, a CoFe layer, a NiFe layer, a CoFeNi layer, a CoZrNb layer, a CoTaZr layer, or a combination thereof. The first Co alloy layer 1 may have a thickness of between about 0.1 nm to about 1 nm, inclusive. The second Co alloy layer 1' may have thickness of between about 0.1 nm to about 1 nm, inclusive. The soft magnetic layer 3 may have a thickness of between about 0.1 nm to about 2 nm, inclusive. According to at least some example embodiments, n may be an integer satisfying $1 \leq n \leq 5$.

In FIGS. 2C and 2D, the crystal orientation layer 5 may be formed of the same or substantially the same material used to form the crystal orientation layer 80, and may have a thickness of between about 0.1 nm to about 2 nm, inclusive. As in FIGS. 2C and 2D, when the third and fourth storage tracks 100c and 100d include the crystal orientation layer 5 on the uppermost parts thereof, the other crystal orientation layer 5 may serve as the oxidation suppression layer. Thus, the oxidation suppression layer 120 may be omitted from the third and fourth storage tracks 100c and 100d.

The first through fourth stack patterns 130a through 130d of FIGS. 2A through 2D may be formed in given or desired shapes by patterning the insulating layer 40, the adhesion layer 60, the crystal orientation layer 80, the storage track (e.g., 100a through 100d), and the oxidation suppression layer 120 after forming the insulating layer 40, the adhesion layer 60, the crystal orientation layer 80, the first through fourth storage tracks 100a through 100d, and the oxidation suppression layer 120 on a substrate. The first through fourth storage tracks 100a through 100d may be deposited using, for example, a magnetron sputtering process. A deposition speed may be between about 0.01 nm/s and about 0.2 nm/s, inclusive. A process pressure may be approximately 5 mT.

Figure 3:
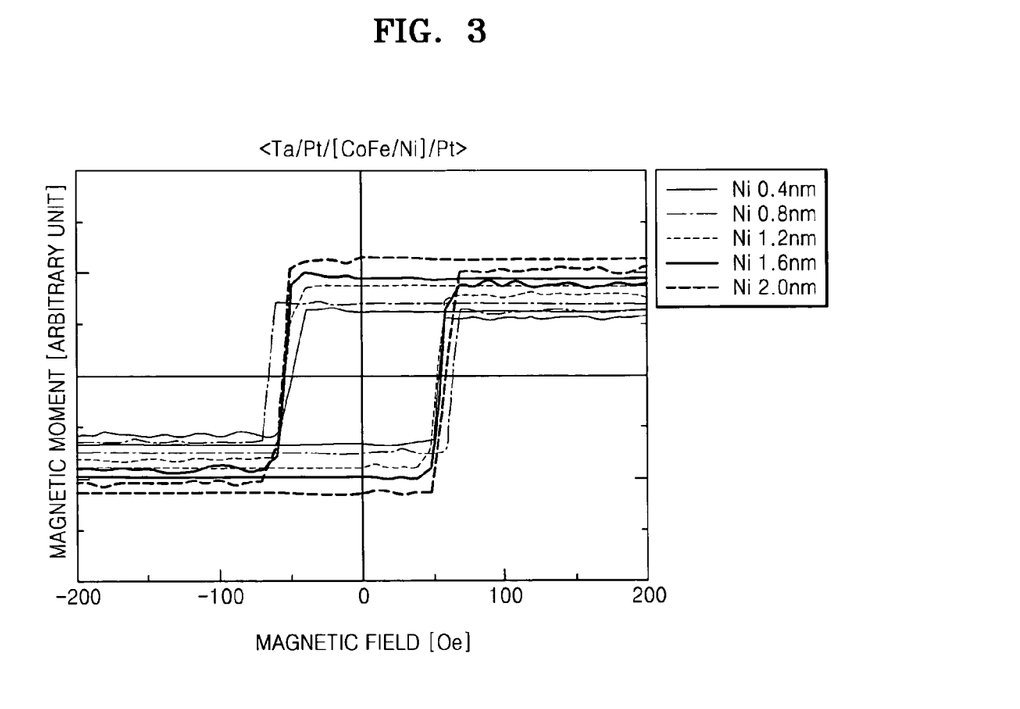
FIGS. 3 through 6 are graphs showing variations of magnetic moment according to a perpendicular magnetic field of storage tracks included in an information storage device according to an example embodiment.
Figure 4:
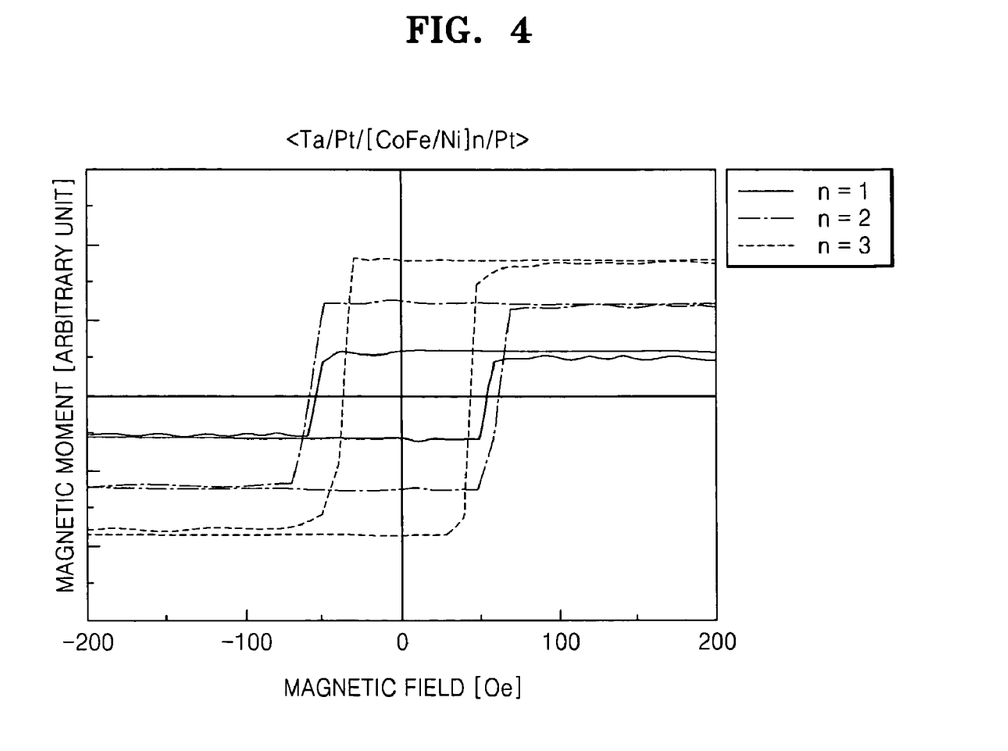

FIGS. 3 and 4 are graphs showing example variations of magnetic moment measured by applying a perpendicular magnetic field to the storage track (the first storage track 100a) having the structure of FIG. 2A.

The magnetic moment of FIG. 3 is a measurement result of a $SiO_2$/Ta/Pt/[CoFe/Ni]/Pt structure in which a $SiO_2$ layer (thickness of 100 nm), a Ta layer (thickness of 5 nm), a Pt layer (thickness of 2.5 nm), a [CoFe layer (thickness of 0.3 nm)/Ni layer], and a Pt layer (thickness of 1 nm) are sequentially stacked on a Si substrate. FIG. 3 shows the example variation of magnetic moment according to a perpendicular magnetic field with varying thickness of the Ni layer. In this example, the $SiO_2$ layer, the Ta layer, the Pt layer, the [CoFe layer/Ni layer], and the Pt layer correspond to the insulating layer 40, the adhesion layer 60, the crystal orientation layer 80, the first storage track 100a, and the oxidation suppression layer 120, respectively.

The magnetic moment of FIG. 4 is a measurement result of a $SiO_2$/Ta/Pt/[CoFe/Ni]$_n$/Pt structure in which a $SiO_2$ layer (thickness of 100 nm), a Ta layer (thickness of 5 nm), a Pt layer (thickness of 2.5 nm), a [CoFe layer (thickness of 0.3 nm)/Ni layer (thickness of 0.4 nm)]$_n$, and a Pt layer (thickness of 1 nm) are sequentially stacked on a Si substrate. FIG. 4 shows an example variation of magnetic moment according to a perpendicular magnetic field with varying n. The $SiO_2$/Ta/Pt/[CoFe/Ni]$_n$/Pt structure corresponds to the first stack pattern 130a of FIG. 2A.

Referring to FIGS. 3 and 4, magnetic hysteresis loops of a typical ferromagnetic material may be confirmed, which indicates that the first storage track 100a of FIG. 2A has a perpendicular magnetic anisotropy. For example, in the magnetic hysteresis loops of FIGS. 3 and 4, the magnetic moment may be changed relatively rapidly, and thus, the first storage track 100a may have a relatively high magnetization reversal characteristic.

In FIG. 3, as the thickness of the Ni layer increases, the magnetic moment increases. This indicates that saturation magnetization Ms and residual magnetization Mr may increase as the thickness of the Ni layer increases from 0.4 nm to 2.0 nm. But, if the magnetic moment of FIG. 3 is converted to magnetization per unit volume, the storage track having a Ni thickness of about 2.0 nm may have a lower (e.g., the lowest or minimum) magnetization per unit volume. Thus, in the case of the storage track having a Ni thickness of about 2.0 nm, switching (e.g., the magnetization reversal) by a current may be achieved more readily.

In FIG. 4, magnetic moment may also increase as n increases. This indicates that saturation magnetization Ms and residual magnetization Mr may increase as the number of stacking of the [CoFe layer/Ni layer] increases from one to three times.

Figure 5:
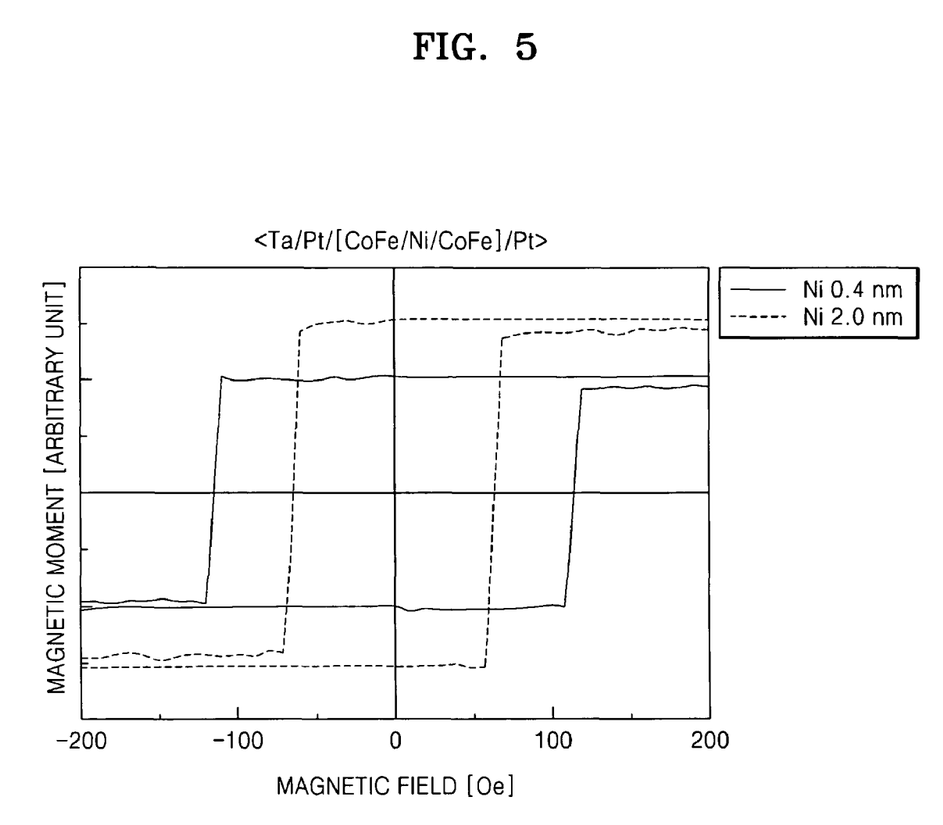
Figure 6:
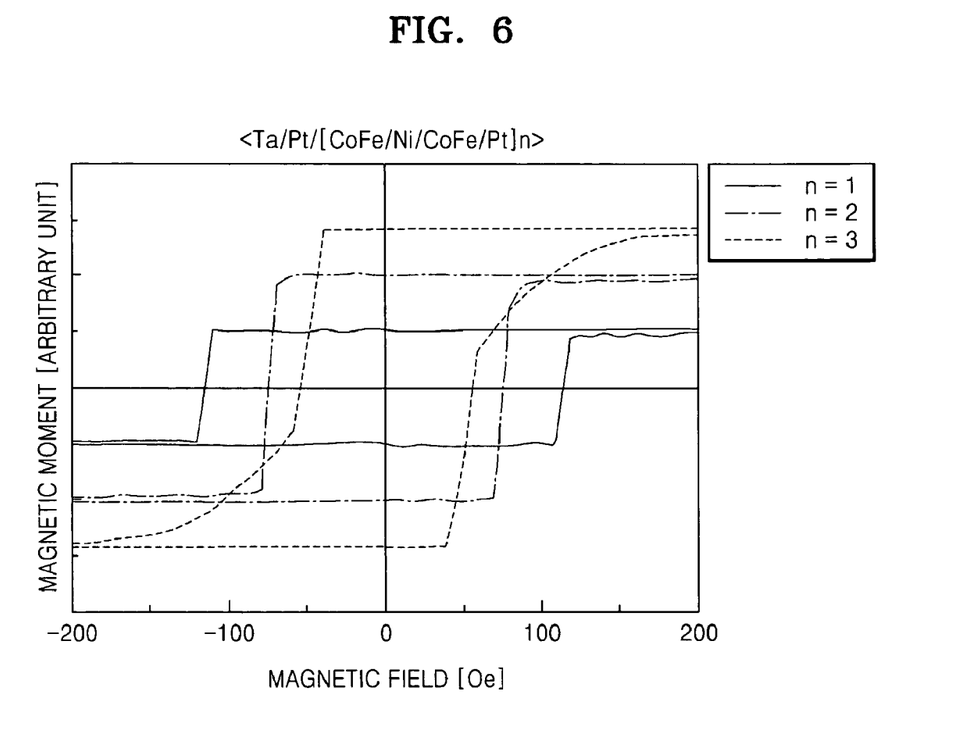

FIGS. 5 and 6 are graphs showing example variations of magnetic moment measured by applying a perpendicular magnetic field to storage tracks (the second and fourth storage tracks) having the structures of FIGS. 2B and 2D, respectively.

The magnetic moment of FIG. 5 is a measurement result of a $SiO_2$/Ta/Pt/[CoFe/Ni/CoFe]/Pt structure in which a $SiO_2$ layer (thickness of 100 nm), a Ta layer (thickness of 5 nm), a Pt layer (thickness of 2.5 nm), a [CoFe layer (thickness of 0.3 nm)/Ni layer/CoFe layer (thickness of 0.3 nm)], and a Pt layer (thickness of 1 nm) are sequentially stacked on a Si substrate. FIG. 5 shows a variation of magnetic moment according to a perpendicular magnetic field with varying thickness of the Ni layer.

The magnetic moment of FIG. 6 is a measurement result of a $SiO_2$/Ta/Pt/[CoFe/Ni/CoFe/Pt]$_n$ structure in which a $SiO_2$ layer (thickness of 100 nm), a Ta layer (thickness of 5 nm), a Pt layer (thickness of 2.5 nm), and a [CoFe layer (thickness of 0.3 nm)/Ni layer (thickness of 0.4 nm)/CoFe layer (thickness of 0.3 nm)/Pt layer (thickness of 1 nm)]$_n$ are sequentially stacked on a Si substrate. FIG. 6 shows a variation of magnetic moment according to a perpendicular magnetic field with varying n.

The magnetic moment of FIG. 5 shows a similar trend in the magnetic moment of FIG. 3, and the magnetic moment of FIG. 6 shows a similar trend in the magnetic moment of FIG. 4.

As shown in FIGS. 3 through 6, the storage track according to example embodiments may have a perpendicular magnetic anisotropy. The magnetic domain wall (hereinafter, referred to as a first magnetic domain wall) of the storage track having the perpendicular magnetic anisotropy may have a width smaller than that of a magnetic domain wall (hereinafter, referred to as a second magnetic domain wall) of a storage track having a horizontal magnetic anisotropy. Also, a critical current for moving the first magnetic domain wall may be smaller than a critical current for moving the second magnetic domain wall. Thus, when the storage track according to an example embodiment is used, an information storage device having relatively high recording density and/or reduced power consumption may be realized.

An information storage device according to at least one other example embodiment may include a plurality of storage tracks identical or substantially identical to the storage track 100 of FIG. 1. In this example, the plurality of storage tracks may be arranged in a direction parallel or substantially parallel to a substrate, may be stacked in a direction perpendicular or substantially perpendicular to the substrate, or may be arranged in directions parallel or substantially parallel and perpendicular or substantially perpendicular to the substrate.

Figure 7A:
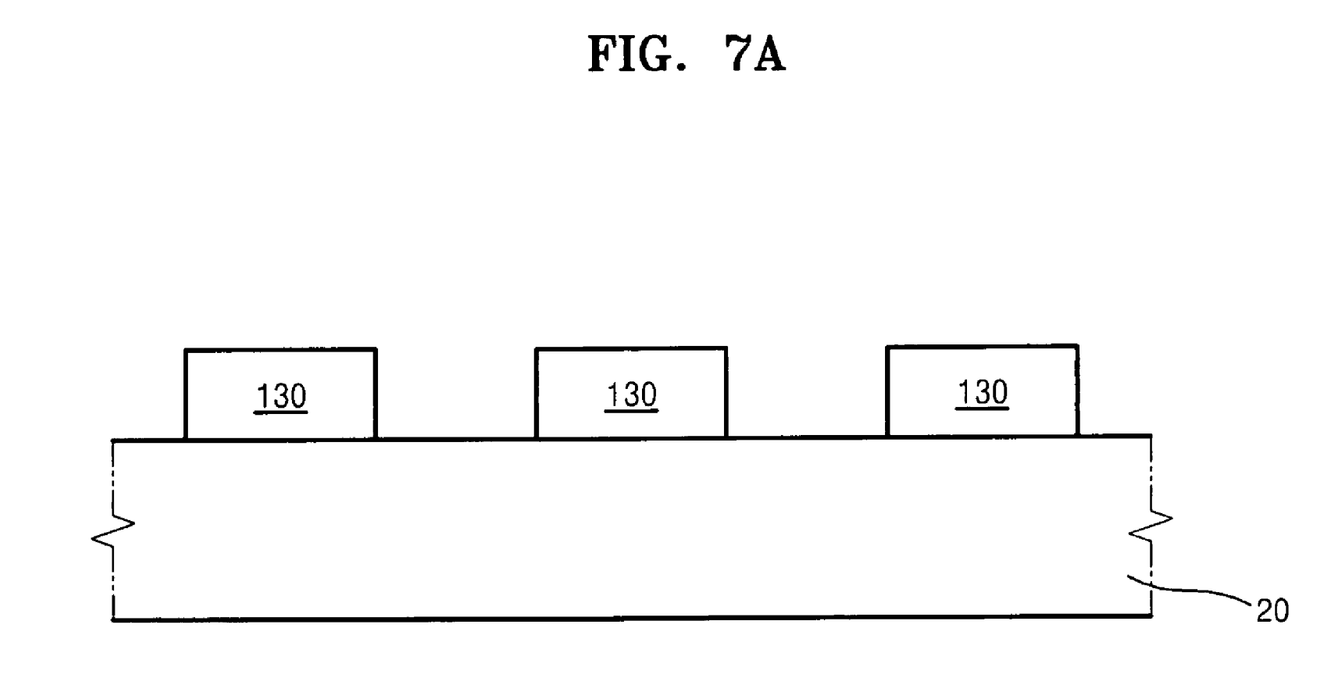
FIGS. 7A and 7B are cross-sectional view illustrating information storage devices according to another example embodiment.
Figure 7B:
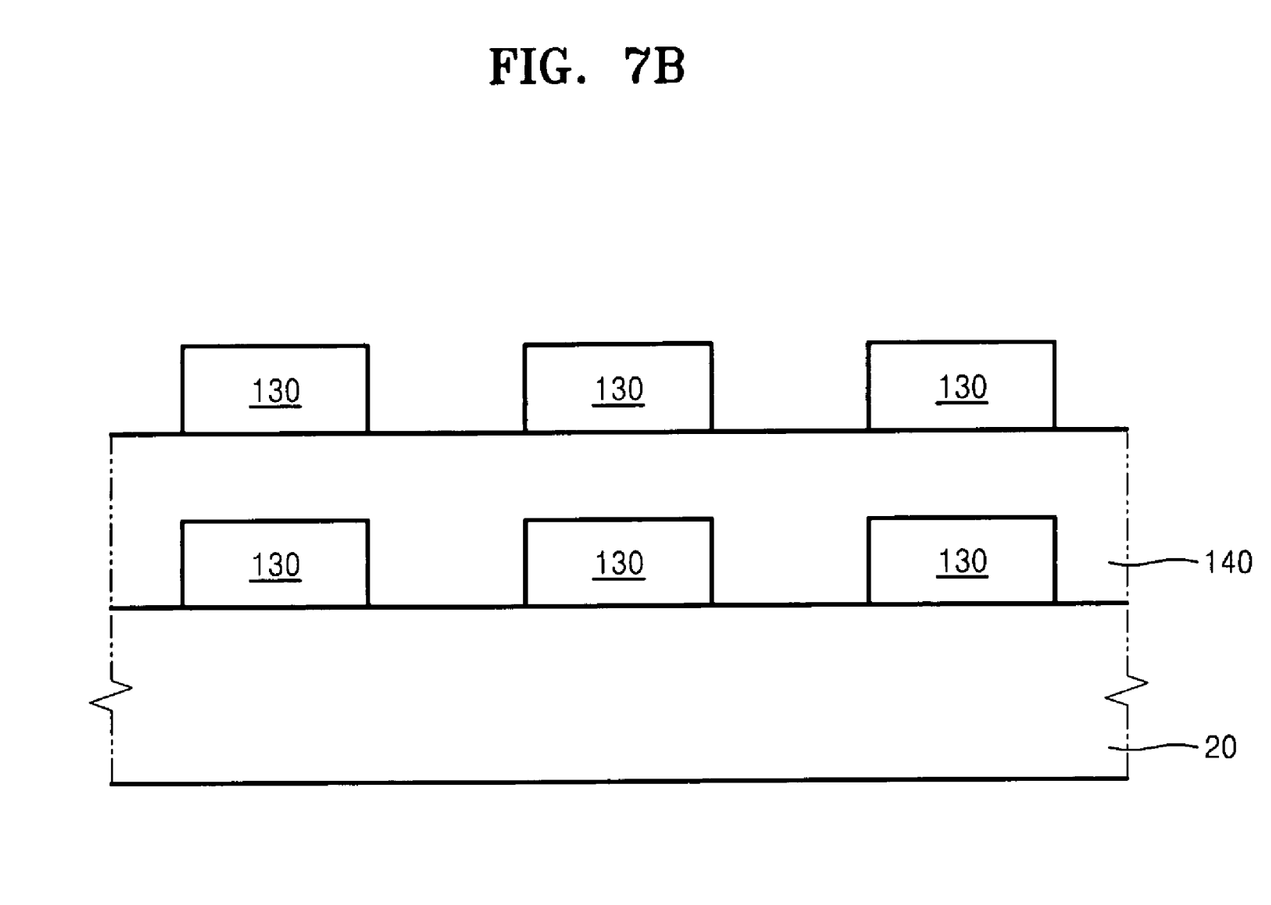

FIG. 7A is a cross-sectional view of an example of a structure in which the storage tracks are arranged in a direction parallel to a substrate 20. FIG. 7B is a cross-sectional view of an example of a structure in which the storage tracks are arranged in directions parallel and perpendicular to the substrate 20.

In FIGS. 7A and 7B, the stack patterns 130 include storage tracks. The stack patterns 130 may have a structure identical or substantially identical to one of the first through fourth stack patterns 130a through 130d depicted in FIGS. 2A through 2D. Each of the stack patterns 130 in FIGS. 7A and 7B may be the same or different. Reference numeral 140 in FIG. 7B indicates an interlayer insulating layer. Although not shown, another interlayer insulating layer covering the stack patterns 130 may also be formed on the substrate 20 of FIG. 7A. Another interlayer insulating layer may be formed on the interlayer insulating layer 140 of FIG. 7B. Additional stack patterns 130 may be stacked on the stack patterns 130 of FIG. 7B. Also, in FIGS. 7A and 7B, a reading unit and a writing unit may be provided on at least one stack pattern 130, and a current applying element may be connected to at least one stack pattern 130. Additionally, at least two stack patterns 130 of the multiple stack patterns 130 may be connected to each other via a soft magnetic layer or a conductive layer.

While example embodiments have been shown and described with reference to the drawings, it should not be construed as being limited to such example embodiments. Those skilled in this art know that the storage tracks of FIGS. 2A through 2D may be applied to any devices which use magnetic domain wall movement. For example, the structures of FIG. 1, FIGS. 2A through 2D, and FIGS. 7A and 7B may be modified in various ways, and the storage tracks 100 and 100a through 100d may also be used for any purposes besides data storage. Therefore, the scope of the present invention is not defined by the detailed description of the invention but by the appended claims.

What is claimed is:

1. An information storage device using magnetic domain wall movement, comprising:
   at least one track including a first Co alloy layer and a soft magnetic layer stacked in a first direction, the at least one track having a plurality of magnetic domains and a magnetic domain wall between each pair of neighboring magnetic domains, the plurality of magnetic domain walls being configured to move in a second direction within first Co alloy layer and the soft magnetic layer of the at least one track, the second direction being perpendicular to the first direction; and
   at least one current applying element connected to the track.

2. The information storage device of claim 1, wherein the track has a multi-layer structure in which the first Co alloy layer and the soft magnetic layer are alternately stacked n times, where n is a positive integer.

3. The information storage device of claim 1, wherein the track has a multi-layer structure in which the first Co alloy layer, the soft magnetic layer, and a second Co alloy layer are alternately stacked n times, where n is a positive integer.

4. The information storage device of claim 3, wherein the second Co alloy layer has a thickness between about 0.1 to about 1 nm, inclusive.

5. The information storage device of claim 3, wherein the second Co alloy layer is a $Co_{(1-x)}Fe_x$ layer, where $0 \leq x \leq 0.4$.

6. The information storage device of claim 1, wherein the track has a multi-layer structure in which the first Co alloy layer, the soft magnetic layer, and a crystal orientation layer are alternately stacked n times, where n is a positive integer.

7. The information storage device of claim 6, wherein the crystal orientation layer includes at least one of Pt, Ru, Ir, Cu, Pd, and Au.

8. The information storage device of claim 1, wherein the track has a multi-layer structure in which the first Co alloy layer, the soft magnetic layer, a second Co alloy layer, and a crystal orientation layer are alternately stacked n times, where n is a positive integer.

9. The information storage device of claim 8, wherein the second Co alloy layer is a $Co_{(1-x)}Fe_x$ layer, where $0 \leq x \leq 0.4$.

10. The information storage device of claim 8, wherein the second Co alloy layer has a thickness between about 0.1 nm and about 1 nm, inclusive.

11. The information storage device of claim 8, wherein the crystal orientation layer includes at least one of Pt, Ru, Ir, Cu, Pd, and Au.

12. The information storage device of claim 1, wherein the first Co alloy layer is a $Co_{(1-x)}Fe_x$ layer, where $0 \leq x \leq 0.4$.

13. The information storage device of claim 1, wherein the soft magnetic layer includes at least one of Co, Fe, and Ni.

14. The information storage device of claim 13, wherein the soft magnetic layer is a Ni layer.

15. The information storage device of claim 1, wherein the first Co alloy layer has a thickness between about 0.1 nm and about 1 nm, inclusive, and the soft magnetic layer has a thickness between about between about 0.1 nm and about 2 nm, inclusive.

16. The information storage device of claim 1, wherein the track has a perpendicular magnetic anisotropy.

17. The information storage device of claim 1, further comprising:
   a crystal orientation layer arranged on a lower surface of the track.

18. The information storage device of claim 17, wherein the crystal orientation layer includes at least one of Pt, Ru, Ir, Cu, Pd, and Au.

19. The information storage device of claim 1, further comprising:
   an oxidation suppression layer arranged on an upper surface of the track.

20. The information storage device of claim 19, wherein the oxidation suppression layer includes at least one of Pt, Ru, Ir, Cu, Pd, and Au.

21. The information storage device of claim 1, including a plurality of tracks.

22. The information storage device of claim 21, wherein the plurality of tracks are arranged in at least one of a direction parallel and a direction perpendicular to a substrate.

23. An information storage device using magnetic domain wall movement, comprising:
   at least one track including a first Co alloy layer and a soft magnetic layer, the at least one track having a plurality of magnetic domains; and
   at least one current applying element connected to the track; wherein
      the at least one track extends in a first direction parallel to a substrate on which the at least one track is disposed,
      the plurality of magnetic domains in each track are arranged in series along the first direction, and
      the first Co alloy layer and the soft magnetic layer are stacked in a second direction perpendicular to the first direction.

* * * * *